United States Patent
Chia

(10) Patent No.: US 8,258,824 B2
(45) Date of Patent: Sep. 4, 2012

(54) HETERODYNE DUAL SLOPE FREQUENCY GENERATION METHOD FOR THE LOAD CHANGE OF POWER SUPPLY

(75) Inventor: Ju-Lin Chia, Zhubei (TW)

(73) Assignee: Powerforest Technology Corp., Hsinchu County (TW)

( * ) Notice: Subject to any disclaimer, the term of this patent is extended or adjusted under 35 U.S.C. 154(b) by 148 days.

(21) Appl. No.: 12/822,482

(22) Filed: Jun. 24, 2010

(65) Prior Publication Data

US 2011/0285452 A1 Nov. 24, 2011

(30) Foreign Application Priority Data

May 24, 2010 (TW) ................................ 99116537 A

(51) Int. Cl.
*H03B 1/00* (2006.01)
(52) U.S. Cl. ........................................ 327/111; 327/108
(58) Field of Classification Search .................. 327/361, 327/109, 110, 111
See application file for complete search history.

(56) References Cited

U.S. PATENT DOCUMENTS

| 5,598,119 | A | * | 1/1997 | Thayer et al. | ................. 327/111 |
| 7,049,801 | B2 | | 5/2006 | Kuo | |
| 7,511,541 | B2 | * | 3/2009 | Chatal et al. | ................. 327/111 |
| 8,115,520 | B2 | * | 2/2012 | Matsumoto et al. | .......... 327/108 |

FOREIGN PATENT DOCUMENTS

TW I279987 4/2007

\* cited by examiner

*Primary Examiner* — Hai L Nguyen
(74) *Attorney, Agent, or Firm* — Ming Chow; Sinorica, LLC

(57) ABSTRACT

A heterodyne dual-slope frequency generation method for the load change of the power supply, which comprises a power transformer, a feedback control circuit, and a dual-slope charge-discharge circuit. The power supply generates different charge current to fit different operating mode through the feedback control circuit, feedback voltage generated into power transformer, and passes through the dual-slope charge-discharge circuit in accordance with the different outer load device and the different outer voltage rising speed. When the outer loading is changed, the feedback control circuit detects error voltage, feeds through power transformer, further changes the supplied current, and finally automatically adjusts the driving current and the output power.

2 Claims, 7 Drawing Sheets

US 8,258,824 B2

HETERODYNE DUAL SLOPE FREQUENCY GENERATION METHOD FOR THE LOAD CHANGE OF POWER SUPPLY

BACKGROUND OF THE INVENTION

1. Field of the Invention

The invention is related to the power supply with the function of the power transform adjustment, particularly for the automatic outer loading detection and additional feedback control to provide the output current and charging period according to the different of the dual-slope power supply.

2. Description of the Prior Art

Regarding the prior art for the dual-slope power controller, the related technology has described the power supply, wherein the output voltage is detected, fed back to the internal detection circuit, compared to internal reference voltage, and generates an error voltage, for which the transformer generates different current driving slope, period and pulse width modulation control signal, finally obtain the control effect for the output driving current.

As shown in FIG. 1, a known power supply control circuit comprises a power transformer 4, a feedback control circuit 8 and an outer loading device 6, wherein the power transformer 4 accepts its input voltage Vin and provides an output voltage Vo to the loading device, and the feedback control circuit 8 output a gate pulse according to the output voltage Vo level, which provides different voltage level through the voltage transformer. When the output loading device 6 is in the larger loading, the feedback control circuit will provides a large gate pulse; otherwise when the output loading device 6 is in smaller loading, the feedback control circuit 8 will provide smaller gate pulse, where the power transformer 4 provides small power output and eliminates the power consumption. Generally, the power transformer 4 can adopt Buck converter, Boost converter, Fly-back Converter, or other different transform controller according to different requirements. Besides, the design of the feedback control circuit 8 majorly adopts pulse width modulation to adjust the control method for the power transformer. Therefore, it is more important for the design of the feedback control circuit 8 to determine the output gate pulse according to the loading status of the outer loading device 6, and the power transformer 4 providing suitable output power to the outer loading device 6.

Refer to FIG. 2, it is the control circuit for the output gate pulse of the feedback control circuit 8 in the previous technology. As shown in FIG. 2, the voltage transform circuit utilizes the input error voltage Ve to control the charging-discharging current value of the storage capacitor 25, and further control the rising-falling period for the capacitor voltage Vramp to achieve the purpose of the gate pulse control. The control circuit includes four current sources, which are the first charging current source 21, the first discharging current source 22, the second charging current source 23, and the second discharging current source, and four set current control switches, which are the first switch 211, the second switch 221, the third switch 231, and the fourth switch 241, and the storage capacitor 25, the controller 26, the charging and discharging circuit 27 and the transform circuit 28, in which the storage capacitor 25 is used to provide the function of charge and discharge. Besides, the first charge current source 21 is connected to the storage capacitor 25 through the first switch 211; the first discharge current source 22 is connected to the storage capacitor 25 through the second switch 221; the second charge current source 23 is connected to the storage capacitor 25 through the third switch 231; the second discharge current source 24 is connected to the storage capacitor 25 through the fourth switch 241; the transform circuit 28 generates an output transform control signal according to the voltage transformation of the error voltage Ve, to adjust the drain current of the second charge current source 23, and output a reset signal (Reset) to the corresponding switch (SW1~SW4) according to the voltage of the switching current CS. The controller 26 has the inputs of the capacitor voltage (Vramp), a high reference voltage level (VH), a low reference voltage level (VL), an output control signal (first and second control signal), an output pulse (CLKOUT), and utilizes the control signal to determine the charge-discharge current value of the charge-discharge storage capacitor 25, the period of the capacitor voltage (Vramp) and the frequency of the gate pulse by the control of the first charge current source 21, the first discharge current source 22, the second charge current source 23, and the second discharge current source 24.

SUMMARY OF THE INVENTION

Regarding the above description, the present invention first provides a kind of the heterodyne dual-slope charge-discharge driving circuit; the primary objective of which is to utilize a set of charge and discharge circuits with a pair of charge-discharge capacitors and the different charge rates because of the different charge current sources to produce different voltage charge frequency, and utilize the different voltage charge frequency to generate the different PWM control signals, which is used to generate different driving current, then the system can provide different output power and reduce the power consumption according to different outer loading.

Another primary objective of the present invention is to utilize a feedback control circuit to do the feedback control according to the output voltage of the outer loading, compare the output voltage and the internal reference voltage of the feedback control circuit to generate an error voltage, and generate different gate pulse according to different magnitude of the error voltage to determine the output driving power by the power transformer and reduce the power consumption.

According to the above objectives, the present invention first provides a kind of the heterodyne dual-slope feedback control circuit 8 includes a feedback error amplifier 314 with its first input terminal connected to the first reference voltage and the second input terminal connected to the feedback error voltage Vfb; a first charge current source 308 connecting to the first terminal of the charge capacitor 306 through the first switch 3011; the first discharge current source 313 connecting to the first terminal of the first charge capacitor 306 through the second switch 3012; a variable charge current source 309 connected to the first terminal of the second charge capacitor 307 through the third switch 3021; a reference threshold voltage circuit 305, in which the first input terminal is connected to the second reference voltage, the output terminal is connected to the first terminal of the second charge capacitor 307 through the fourth switch 3022, and the output terminal is fed back to the second input terminal; a heterodyne dual-slope voltage comparator 303, in which the first input terminal is connected to the first terminal of the first charge capacitor 306, the second input terminal is connected to the first terminal of the second charge capacitor 307, and the output terminal generates an output signal; and a signal controller 304, in which the input terminal is connected to the output signal of the heterodyne dual-slope voltage comparator 303, and output four corresponding signals to control the first switch 3011, the second switch 3012, the third switch 3021, and the fourth switch 3022; where the feedback error voltage Vfb is used to adjust the variable charge current source 309 and the variable charge current source 309 will charge the second charge capacitor 307 by the different current value.

The present invention further provides a kind of the heterodyne dual-slope feedback control circuit 8 includes a feedback error amplifier 314 with its first input terminal connecting to the first reference voltage Vref1 and the second input terminal connecting to the feedback error voltage Vfb; a first charge current source 308 connecting to the first terminal of the charge capacitor 306 through the first switch 3011; the first discharge current source 313 connecting to the first terminal of the first charge capacitor 306 through the second switch 3012; a variable charge current source 309 connected to the first terminal of the second charge capacitor 307 through the third switch 3021; a reference threshold voltage circuit 305, in which the first input terminal is connected to the second reference voltage, the output terminal is connected to the first terminal of the second charge capacitor 307 through the fourth switch 3022, the output terminal is fed back to the second input terminal; a heterodyne dual-slope voltage comparator 303, in which the first input terminal is connected to the first terminal of the first charge capacitor 306, the second input terminal is connected to the first terminal of the second charge capacitor 307, and the output terminal generates an output signal; and a signal controller 304, in which the input terminal is connected to the output signal of the heterodyne dual-slope voltage comparator 303, and output four corresponding signals to control the first switch 3011, the second switch 3012, the third switch 3021, and the fourth switch 3022. Wherein the characteristic of the heterodyne dual-slope control circuit 30 lies in that: the first charge current source 208 is a fixed current source, the second charge current source 209 is a variable charge current source, and the first charge capacitor 306 and the second charge capacitor 307 are charged and discharged by the cross voltage derived from the first charge slope, generated by the first charge current source 30 charging the first charge capacitor 306, and the second charge slope, generated by the variable charge current source charging the second charge capacitor 307 with the different current value.

The present invention further provides a kind of the power supply system, which includes a power transformer 4, in which the first input terminal is connected with the input voltage and the output terminal is connected to a loading device 6; a heterodyne dual-slope feedback control circuit 30, where the input terminal is connected to the output of the power transformer 4 and the output terminal, which is a control signal, is connected to the another input terminal of the power transformer. Wherein the characteristic of the power supply system lies in that: a heterodyne dual-slope feedback control circuit 8 further includes a feedback error amplifier 314 with its first input terminal connecting to the first reference voltage and the second input terminal connecting to the feedback error voltage Vfb; a first charge current source 308 connecting to the first terminal of the charge capacitor 306 through the first switch 3011; the first discharge current source 313 connecting to the first terminal of the first charge capacitor 306 through the second switch 3012; a variable charge current source 309 connecting to the first terminal of the second charge capacitor 307 through the third switch 3021; a reference threshold voltage circuit 305, in which the first input terminal is connected to the second reference voltage, the output terminal is connected to the first terminal of the second charge capacitor 307 through the fourth switch 3022, the output terminal is fed back to the second input terminal; a heterodyne dual-slope voltage comparator 303, in which the first input terminal is connected to the first terminal of the first charge capacitor 306, the second input terminal is connected to the first terminal of the second charge capacitor 307, and the output terminal generates an output signal; and a signal controller 304, in which the input terminal is connected to the output signal of the heterodyne dual-slope voltage comparator 303, and output four corresponding signals to control the first switch 3011, the second switch 3012, the third switch 3021, and the fourth switch 3022. Wherein the characteristic of the heterodyne dual-slope control circuit 30 lies in that: the first charge current source 208 is a fixed current source, the second charge current source 209 is a variable charge current source, and the first charge capacitor 306 and the second charge capacitor 307 are charged and discharged by the cross voltage derived from the first charge slope, generated by the first charge current source 30 charging the first charge capacitor 306, and the second charge slope, generated by the variable charge current source charging the second charge capacitor 307 with the different magnitude of the current.

DESCRIPTION OF THE PREFERRED EMBODIMENT

The present invention primarily discloses a kind of heterodyne dual-slope power supply, particularly by utilizing the charge-discharge slope of the two charge capacitor to switch the current on-off signal, which determines the output PWM control signal period time of the feedback control circuit and output different voltage period through the transform circuit to obtain the different output voltage power.

Figure 3:
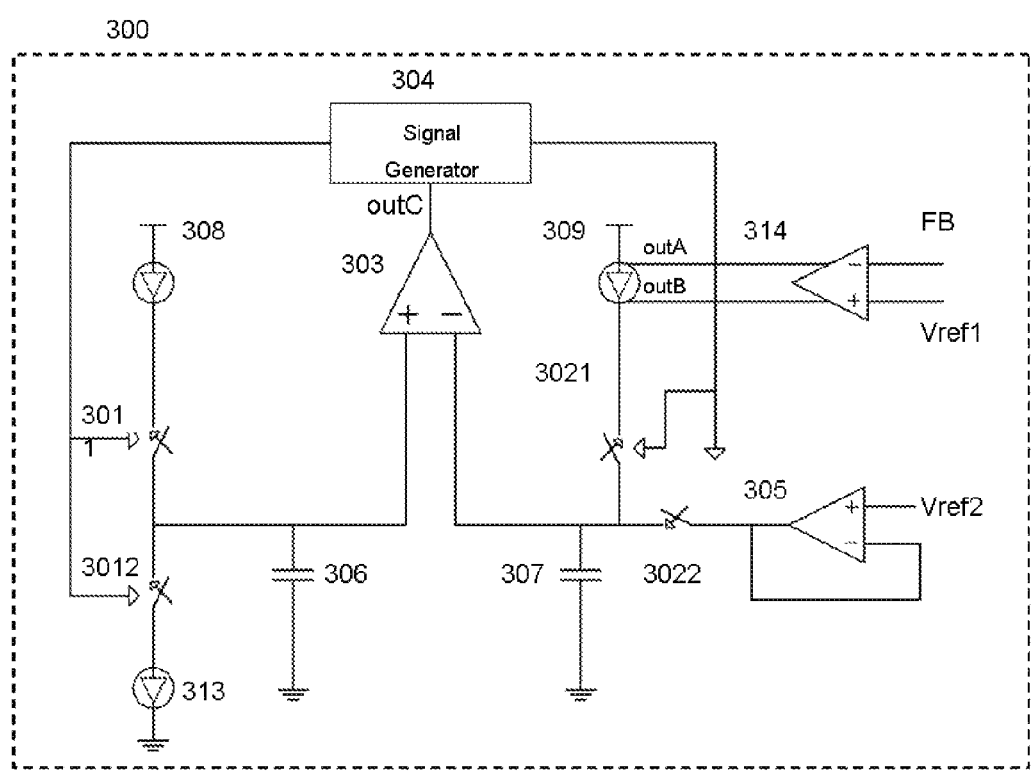
FIG. 3 is a diagram of the heterodyne dual-slope charge-discharge of the present invention.

Referring to FIG. 3 firstly is the circuit diagram of the heterodyne dual-slope control circuit 30 for the present invention. As shown in FIG. 3, the heterodyne dual-slope control circuit 30 includes a first switch (SW1) 3011, a second switch (SW2) 2012, a third switch (SW3) 3021, the fourth switch (SW4) 3022, a heterodyne dual-slope voltage capacitor 303, a signal controller 304, a reference threshold circuit 305, a first charge capacitor (C1) 306, a second charge capacitor (C2) 307, a charge current source (I1) 308, a second charge current source (I2) 309, a discharge current source 313, a feedback error amplifier 314, a first reference voltage Vref1, a second reference voltage Vref2, and a feedback error voltage Vfb; wherein the first charge current source 308 is a fixed current source, and the second charge current source 309 is a variable current source which changes its current value according to the output signal of the feedback error amplifier.

Furthermore, the feedback error amplifier 314 of the heterodyne dual-slope control circuit 30 has two input terminals, therein the first terminal (ie, positive terminal) is connected to the first reference voltage Vref1, the second terminal (ie, negative terminal) is connected to feedback error voltage Vfb, and the output terminals have two control signals OutA, OutB, which are correspondingly connected to the internal switches of the second charge current source 309 (ie, the variable current source). Then, the second charge current source 309 is connected to the second charge capacitor (C2) 307 through the third switch (SW1) 3021; the first charge current source 308 is connected to the first charge capacitor 306 through the first switch 3011; the discharge current source 313 is connected to the first charge capacitor 306 through the second switch; the output voltage of the first charge capacitor 306 is connected to the first input terminal (ie, the positive terminal) of the heterodyne dual-slope voltage comparator 303, and the output voltage of the second charge capacitor 307 is connected to the second input terminal (ie, negative terminal) of the heterodyne dual-slope voltage comparator 303. Besides, the output terminal of the heterodyne dual-slope voltage comparator 303 is connected to the input terminal of the signal controller 304, and the output terminals of the signal controller 304 are connected to the first switch 3011, the second switch 3012, the third switch 3021, and the fourth switch 3022; wherein the signal controller 304 is composed of the AND gate, OR gate, and the inverter logics, the input control signals processed by the internal logics will generate different delay and non-overlap inverting signals which are used to control the on-off time for each of the above switches. The second reference voltage Vref2 is connected to the first input terminal (ie, positive terminal) of the reference threshold voltage circuit 305, and simultaneously the output terminal of the reference threshold voltage circuit 305 will be connected to the second terminals (ie, the negative terminal) and be connected to the second charge capacitor 307 through the fourth switch 3022.

Figure 4:
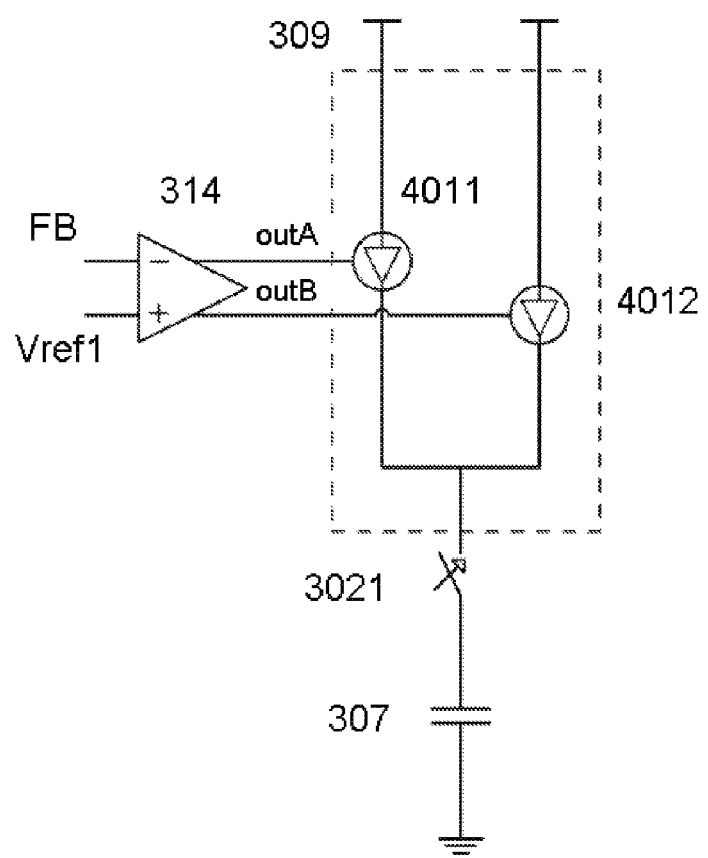
FIG. 4 is a diagram of the variable current source circuit structure of the present invention.

The actual circuit structure for the above second charge current source 309 is shown as FIG. 4. The second charge current source 309 includes a first variable current source 4011 and a second variable current source 4012, and the output terminal of the first current source 4011 is connected to the third switch 3021; Besides, the output terminal of the second variable current source 4012 is connected to the third switch, and the output terminals OutA, OutB of the feedback error amplifier 314 are connected to the first variable current source 4011 and second variable current source 4012. When the outer loading is changed, the feedback error voltage Vfb is also changed, thereby the two output control signals OutA, OutB are used to control the first variable current 4011 and the second variable current 4012, which makes the first variable current 4011 and the second variable current 4012 have the linear voltage change corresponding to the feedback error voltage Vfb value change, and further control the internal resistance value of the first variable current 4011 and the second variable current 4012. The internal resistance value of the first variable current 4011 and the second variable current 4012 can determines the output current value of the first variable current source 4011 and the second variable current source 4012, hence, the variable current source 309 can output a linear variable current.

Referring to FIG. 3, when the first switch (SW1) 3011 is turned on (ON), the first charge current source 308 starts to charge the first charge capacitor (C1) 306 with a fixed current, and the signal controller 304 will continue to turn on the first switch (SW1) 3011, turn off the second switch (SW2) 3012, turn on the third switch (SW3) 3021, and turn off the fourth switch (SW4) 3022 during the charging time for the first charge capacitor (C1) 306 being charged to the first charge voltage (Vrp1); where the second charge voltage (Vrp2) on the second charge capacitor (C2) 307 will continue increasing from the second reference voltage Vref2 (ie, a DC value), and the first input terminal (ie, the positive terminal), which is the second reference voltage, of the reference threshold voltage circuit 305 is the clamp voltage, and is used to provide a fixed DC reference voltage level, and at the same time is also used as the starting voltage Vref2 of the second charge capacitor 307, and achieves a stable voltage through the design of the reference threshold voltage circuit 305. Besides, in the embodiment of the present invention, the current value of the first charge current source 308 is the integer multiple value of the second charge current source 309, so the first charge current source 308 will use a fast charging rate to charge the first charge capacitor 306 to the first charge voltage (Vrp1), of which the first charge rate has a first slope; Besides, because of the DC value, that is the second reference voltage Vref2, on the second charge capacitor (C2) 307, the second charge current source 309 will use the second charge rate to the charge the second charge capacitor 307 from the DC voltage Vref2 to the second charge voltage (Vrp2), where the second charge rate has a second slope. Therefore, when the first charge capacitor (C1) 306 and the second charge capacitor (C2) 307 are all in the charging status, the first charge capacitor (C2) 307 is charged to the first charge voltage (Vrp1) with a larger current (that is, the first charge current source 308) and the second charge capacitor (C2) 307 is charged with a small current (that is, the second charge current source 309) from a starting voltage (ie, a DC value) to the second charge voltage (Vrp2). Apparently for the circuit design of the present invention, when the first charge capacitor (C1) 306 and the second charge capacitor (C2) 307 are all in the charging status, the first charge capacitor (C1) 306 will be charged to the first charge voltage (Vrp1) with a faster charge rate (ie, the first slope), and the voltage on the first charge capacitor will gradually catch up with the voltage on the second charge capacitor 307 which is charged with a charge rate having the second slope to the second charge voltage (Vrp2); when the first charge voltage (Vrp1) reaches the second charge voltage (Vrp2), the signal controller 304 will use the output of the heterodyne dual-slope voltage comparator to do the inverting control of the control signals. Obviously, in the embodiment of the present invention, the first charge capacitor 306 is the same or maintains a certain proportional relation with the second charge capacitor 307. For example, when the proportion of the first charge capacitor related to the second charge capacitor is changed, the charge and discharge time for the first charge capacitor 306 and the second charge capacitor 307 will be changed, hence, the charge and discharge period for the first charge capacitor 306 and the second charge capacitor will also be changed proportionally.

When the first charge voltage (Vrp1) catches up with the second charge voltage (Vrp2), the output of the heterodyne dual-slope voltage comparator 303 will be changed, and the signal controller 304 will output related inverting control signals, which turns off the first switch (SW1) 3011, turns on the second switch (SW2) 3012, turns off the third switch (SW3) 3021, and turns on the fourth switch (SW4) 3022. According to the circuit diagram of the FIG. 3 in the present invention, the first charge capacitor (C1) 306 and second charge capacitor (C2) 307 are simultaneously in the discharge status until the first charge voltage (Vrp1) on the first charge capacitor (C1) 306 is continuously discharged to a predetermined low voltage status. Then, the first charge capacitor (C1) 306 and the second charge capacitor (C2) 307 will return to the charging status. Where the first charge capacitor 306 will be discharged through the first discharge current source 313, and the second charge capacitor is discharged through the discharge path provided from the internal equivalent resistance of the reference threshold voltage circuit 305. Thus, by the design of the circuit diagram in FIG. 3 of the present invention, the heterodyne dual-slope control circuit 30 can use the charge process and the discharge voltage change status of the first charge capacitor (C1) 306 and the second charge capacitor (C2) 307 to determine whether the first charge capacitor (C1) 306 and the second charge capacitor (C2) 307 are in the charge period or in the discharge period, then continue processing repeatedly.

Because the second terminal (ie, the negative terminal) of the feedback error amplifier 314 is connected to the feedback error voltage Vfb and the feedback error voltage is the feedback signal generated from the outer loading of the power supply, the current on the second charge current source 309 becomes controllable by the connection between the output terminal of the feedback error amplifier 314 and the variable current source (ie, the second charge current source 309). For example, when the loading connected to the power supply is light loading, the feedback error voltage Vfb will become small and the output current of the second charge current source (Ic2) 309 become large. When the loading connected with the power supply is heavy loading, the feedback error voltage Vfb will become large and the output current of the second charge current source (Ic2) 309 will become small.

When the outer loading connected to the heterodyne dual-slope control circuit 30 in the present invention is light loading, the feedback error voltage on the second terminal (ie, the negative terminal) of the feedback control circuit 314 will become small, and the driving current of the second charge current source (Ic2) 309 will become large through the feedback error amplifier 314 controlling, which leads to the second charge voltage (Vrp2) on the second charge capacitor (C2) 307 being charged with a fast rate. Because the output current of the first charge current source (Ic1) 308 is raised with a fixed rate and the voltage on the second charge capacitor 307 is raised with a faster rate, the first current source (Ic1) 308 needs more time to charge the first charge capacitor 306 to approach the second charge voltage (Vrp2) on the second charge capacitor (C2) 307. Apparently, because of the extended charge time for the first charge capacitor (C1) 306 and the second charge capacitor (C2) 307, it makes the voltage value higher for the first charge voltage (Vrp1) approaching the second charge voltage (Vrp2), further makes the extended discharge time for the first charge capacitor (C1) 306 approaching the predetermined low voltage value. At the same time, the charge and discharge period processed and detected by the feedback control circuit for the first charge capacitor 306 and the second charge capacitor 307 also determines the last output PWM control signal. Therefore, the last output PWM control signal will keep in longer low voltage time, which leads to the voltage adjustment frequency become small, output power become small, and reduce the power consumption.

Figure 5:
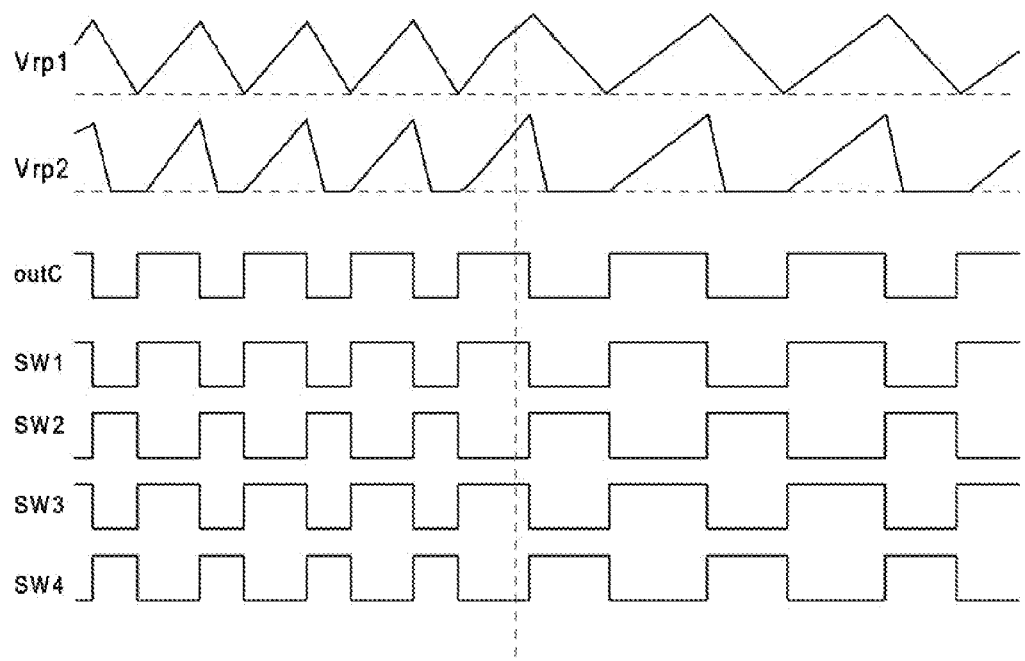
FIG. 5 is a waveform diagram of the capacitor charge-discharge and the switch on-off of the present invention.

Referring to FIG. 5 is the signal diagram for the output of the heterodyne dual-slope voltage comparator and the output of the signal controller. As shown in FIG. 5, when the first charge voltage Vrp1 approaches the second charge voltage Vrp2, the output OutC of the heterodyne dual-slope voltage comparator 303 will become low voltage instead of the high voltage.

When the outer loading of the heterodyne dual-slope control circuit 30 in the present invention is heavy loading, the feedback error voltage Vfb of the second terminal (ie, negative terminal) of the feedback error amplifier 314 becomes large, and the driving current of the second charge current source (Ic2) 309 by the control of the feedback error amplifier 314, which leads to the second charge voltage (Vrp2) on the second charge capacitor (C2) 307 is raised with slower rate; when the first charge current source (Ic1) 308 is raised with a fixed rate and the second charge capacitor (C2) 307 is raised with a slower rate, the first charge current source (Ic1) 308 only needs a short period to charge the first charge capacitor (C1) 306 to catch up with the second charge voltage (Vrp2) of the second charge capacitor (C2) 307. Apparently, the charge time for the first charge capacitor (C1) 306 and the second charge capacitor (C2) will be shortened, which makes the output PWM control signal in the lower voltage status and leads to the voltage adjustment frequency become large, output power become large, and achieve the real time adjustment for the outer loading.

Figure 6:
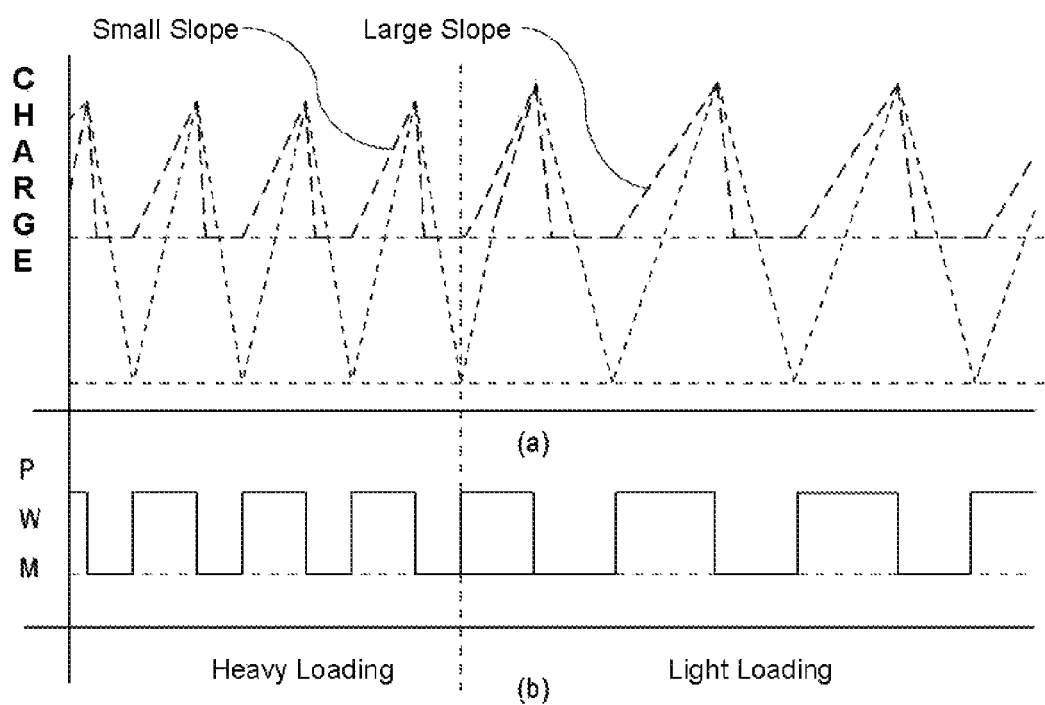
FIG. 6 is a waveform diagram of the capacitor charge-discharge and the output gate pulse.

For the further explanation of the operation of the heterodyne dual-slope control circuit in the present invention, please refer to FIG. 6(a) or FIG. 6(b) is the corresponding diagram for the capacitor charging and discharging and the gate pulses of the light or heavy loading. Firstly, as shown in FIG. 6(a), when outer loading is heavy, the feedback error voltage Vfb of the second terminal (ie, the negative terminal) of the feedback error amplifier 314 of the heterodyne dual-slope control circuit 30 becomes large, by the control of the feedback error amplifier 314, the second charge current source (Ic2) 309 outputs a small current; additionally, because of the second reference voltage Vref2 of the first input terminal (ie, the positive terminal) of the reference threshold voltage circuit 305 providing a fixed clamp voltage, it makes the heterodyne cross charge voltage for the first charge capacitor (C1) 306 and the second charge capacitor (C2) 307 accompanied change. In this situation, the cross time for the first charge voltage (Vrp1) and the second charge voltage (Vrp2) will be shortened, that is, the cross voltage for the first charge voltage (Vrp1) and the second charge voltage (Vrp2) is lower, so the charge-discharge frequency for the first charge capacitor (C1) 306 and the second charge capacitor (C2) 307 will become faster, which makes the output PWM control signal period of the feedback controller shortened and provides enough output power. When the outer loading is light, the feedback error voltage Vfb on the second terminal (ie, the negative terminal) of the feedback error amplifier 314 of the heterodyne dual-slope controller circuit 30 becomes small, by the control of the feedback error amplifier 314, the second charge current source (Ic2) 309 outputs a large current, and the second reference voltage Vref2 of the first input terminal (ie, the positive terminal) of the reference threshold voltage circuit 305 provides a fixed clamp voltage, which lets the second charge current source (Ic2) have a charging rate from the clamp voltage, which leads to the charging rate of the second charge current source (Ic2) 309 is changed, which makes the heterodyne cross charging voltage for the first charge capacitor (C1) 306 and the second charge capacitor (C2) 307 also changed. Under this situation, the cross time for the first charge voltage (Vrp1) and the second charge voltage (Vrp2) will become longer, that is, the cross voltage for the first charge voltage (Vrp1) and the second charge voltage (Vrp2) will becomes higher, which leads to the charge-discharge period for the first charge capacitor (C1) 306 and the second charge capacitor (C2) 307 will also becomes longer. Hence, the charge-discharge frequency for the first charge capacitor (C1) 306 and the second charge capacitor (C2) 307 will become slower, finally the PWM control signal period for the feedback control will become longer and reduce the power consumption.

For further explanation, when the outer loading is light loading, the second charge capacitor voltage (Vrp2) keep in a higher DC level; for example, the second reference voltage Vref2 provides a DC voltage level 2V; hence, the second charge current source 309 starts charging the second charge capacitor (C2) 307 from the DC voltage level 2V with a faster rate; in addition, the charge current source (Ic1) 308 starts charging the first charge capacitor (C1) 306 from a lower DC voltage level, for example, the DC voltage level is 0.7 V. Because the first charge current source (Ic1) 308 related to the second charge current source (Ic2) 309 has a proportional relationship; for example, the current value of the first charge current source (Ic1) 308 is the integer multiple value related to the current value of the second charge current source (Ic2) 309. Hence, in the present invention, the first charge current source (Ic1) 308 always provides a larger current to charge the first charge capacitor (C1) 306, so the first charge voltage (Vrp1) will catch up with the second charge voltage (Vrp2). In this situation, the cross time for the first charge voltage (Vrp1) and the second charge voltage (Vrp2) will become longer, that is, the cross voltage for the first charge voltage (Vrp1) and the second charge voltage (Vrp2) will become higher, therefore, the charge-discharge period for the first charge capacitor (C1) 306 and the second charge capacitor (C2) 307 will become longer. When the first charge capacitor voltage (Vrp1) exceeds the second charge capacitor voltage (Vrp2), the output signals of the heterodyne dual-slope voltage comparator 303 will soon be inverted and be input to the signal controller 304 and on-off control signal generated from the signal controller 304 will inverted control all the current source control switches. Because the feedback control switch paths are the logic control circuits, the current source control switch signals are inverted and are input to the all current source switches in a very short time. At the same time, the first charge capacitor (C1) 306 and the second charge capacitor (C2) 307 start discharging, and the voltage on these capacitors will return to their initial value; for example, the initial state is set as the 0.7V, and repeats the next periodic operation.

Then, when the outer loading is heavy loading, the second charge voltage (Vrp2) will maintain a higher DC voltage level; for example, the second reference voltage Vref2 provides a DC voltage level 2V; hence, the second charge current source 309 starts charging from the DC voltage level 2V, and use a slower charge rate to charge the second charge capacitor (C2) 307; on the other hand, the charging method of the charge current source (Ic1) 308 for the first charge capacitor (C1) 306 is the same as the one for the outer light loading; hence, the difference for the light loading and heavy loading related to FIG. 6(a) is that the second charge current source 309 starts charging the second charge capacitor (C2) 307 from the DC voltage level 2V with a slower rate. In this situation, the cross time of the first charge voltage (Vrp1) and the second charge voltage (Vrp2) will also be shortened, that is, the cross voltage for the first charge voltage (Vrp1) and the second charge voltage (Vrp2) will become lower. Therefore, the charging period for the first charge voltage (Vrp1) and the second charge voltage (Vrp2) will be shortened.

As shown in FIG. 6(b), the gate pulse (PWM control signal) is the output of the heterodyne dual-slope voltage comparator through the process of the signal controller and the feedback control circuit during the charge-discharge period of the heterodyne dual-slope capacitor. When the capacitor is in its charging time, the output voltage pulse of the heterodyne dual-slope voltage comparator is in the high voltage level; when the heterodyne dual-slope capacitor is in the discharge time, the output voltage pulse of the heterodyne dual-slope voltage comparator is in the low voltage level and the output voltage pulse of the heterodyne dual-slope voltage comparator, during the charge-discharge period of the heterodyne dual-slope capacitor and by the minor signal adjustment of the signal controller, forms a gate pulse control period, which is input to the power supply and is used to adjust the output power of the power supply. When the outer loading is changed from the heavy loading to the light loading, the charge-discharge period for the first charge capacitor voltage (Vrp1) and the second charge capacitor voltage (Vrp2) become large, and the corresponding gate pulse period also becomes larger, which makes the output voltage smaller and reduces the power consumption.

Figure 7:
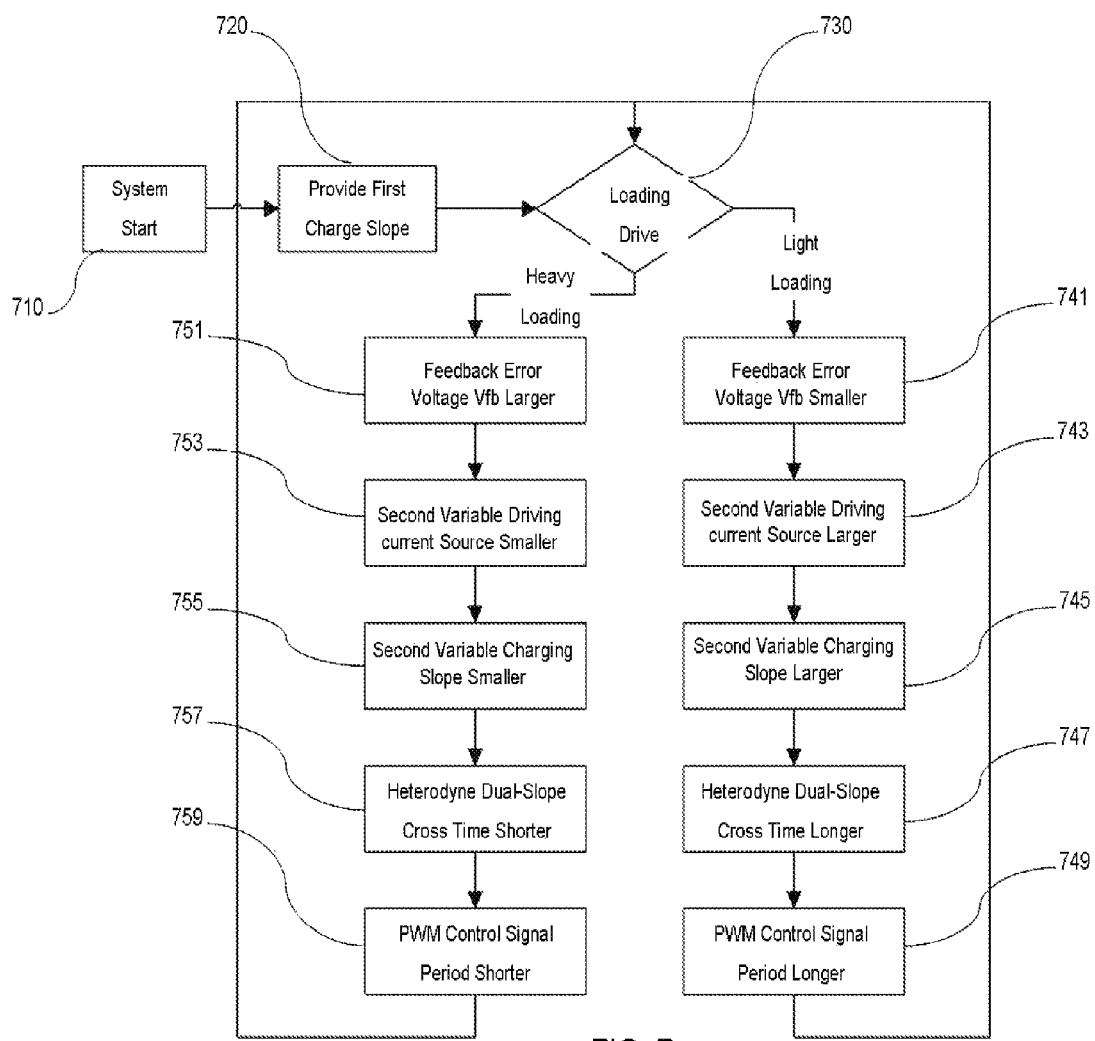
FIG. 7 is a flow diagram of the heterodyne dual-slope charge-discharging circuit operation of the present invention.

Please referring to FIG. 7 is the control method of the heterodyne dual-slope control circuit in the present invention. As shown in FIG. 7, firstly the step 710 will enter the step 720 when the power supply system starting, which makes the first (ie, the fixed) charge current source (Ic1) 308 start charging the first charge capacitor (C1) 306 with a fixed current from a lower DC voltage level; for example, the DC voltage level is 0.7V, by that the fixed first slope is generated from the first charge capacitor charging; Next, entering the step 730, the system will drive the outer loading and judge the outer connected loading status; when the power supply system determines that the outer loading is the light loading, then, the system will enter the step 741 and the feedback error voltage Vfb on the second terminal (ie, negative terminal) of feedback error amplifier 314 of the heterodyne dual-slope control circuit 30 becomes smaller; Then, the system enters the step 743, through the control of feedback error amplifier 314, makes the second (ie, the variable) charge current source (Ic2) 309 output large current; following the system enters the step 745, and the second charge capacitor voltage (Vrp2) keeps in a higher DC voltage level to do the large current charging. For example, the second reference voltage Vref2 provides a DC voltage level 2V; hence, the second (ie, the variable) charge current source 309 starts charging from the DC voltage level 2V, and charge the second charge capacitor (C2) 307 with a faster rate, which generates a larger second slope; next, the system enters the step 747, and do the heterodyne control for the heterodyne dual-slope; where because the current value of the first (ie, the fixed) charge current source (Ic1) 308 is the integer multiple of the one provided from the second (ie, the fixed) charge current source (Ic2) 309; hence, the first (ie, the fixed) charge current source (Ic1) 308 always can provides a larger current to charge the first charge current capacitor (C1) 306, so the first charge voltage (Vrp1) catches up with the second charge voltage (Vrp2). In the mean time, the cross time for the first charge voltage (Vrp1) and the second charge voltage (Vrp2), and following the system enters the step 749, the cross voltage is higher for the first charge voltage (Vrp1) and the second charge voltage (Vrp2), which makes the charge-discharging period longer for the first charge capacitor (C1) 306 and the second charge capacitor (C2) 307. In this situation, the charge-discharge frequency for the first charge capacitor (C1) 306 and the second charge capacitor (C2) 307 will slow down, hence, the PWM control signal period of the feedback control will be strengthen and reduce the power consumption. Then following, the system repeats the next periodic operation.

When the outer connected loading is changed to the heavy loading in the step 730, the system enters the step 751 and the feedback error voltage Vfb on the second terminal (ie, negative terminal) of the feedback error amplifier 314 in the heterodyne dual-slope control circuit 30 becomes larger; Next, the system enters the step 753, through the control of the feedback error amplifier 314, and the second charge current source (Ic2) 309 outputs a small current; then following, the system enters step 755, and the second (ie, the variable) charge current source (Ic2) 309 outputs a small current to charge the second charge capacitor to the second charge voltage (Vrp2) with a higher starting DC voltage level, which generates a smaller second slope (ie, the second slope related to the light loading); Next, the system enters the step 757 which does the heterodyne control of the heterodyne dual-slope; because the current value of the first (ie, the fixed) charge current source (Ic1) 308 are the integer multiple value of the one of the second (ie, variable) charge current source (Ic2) 309, the first charge voltage (Vrp1) catches up with the second charge voltage (Vrp2), and at that time the cross time for the first charge voltage (Vrp1) and the second charge voltage (Vrp2) will become shorter; then following, the system enters the step 759, and the cross voltage will become lower for the first charge voltage (Vrp1) and the second charge voltage (Vrp2), where results in the charge and discharge period for the first charge capacitor (C1) 306 and the second charge capacitor (C2) 307 will become shorter. In this situation, the charge and discharge frequency for the first charge capacitor (C1) 306 and the second charge capacitor (C2) 307 will become faster, and finally the PWM control signal period of the feedback control will be shortened, which leads to the power supply; then, the system will repeat the next periodic operation.

Figure 1:
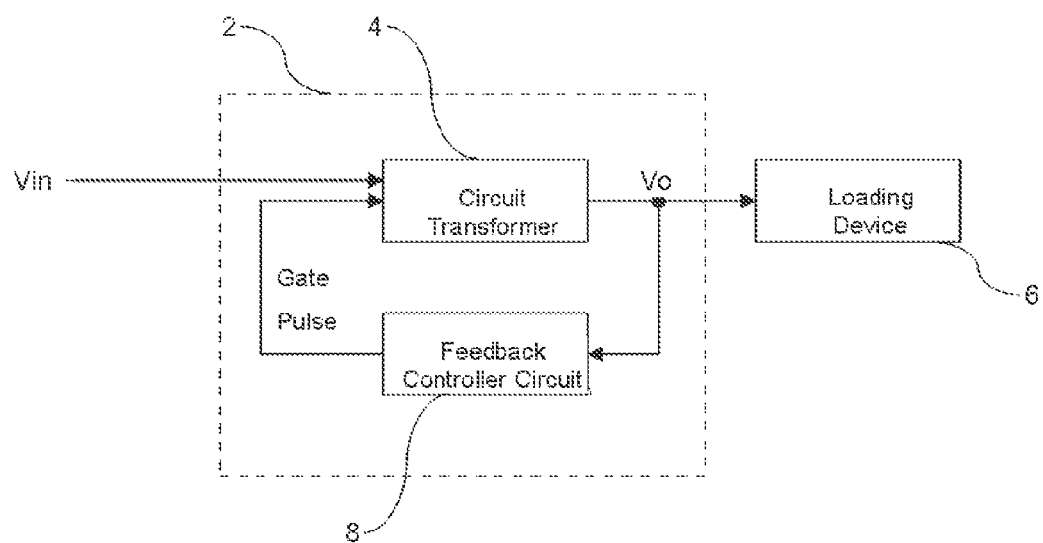
FIG. 1 is a block diagram of the power supply.
Figure 2:
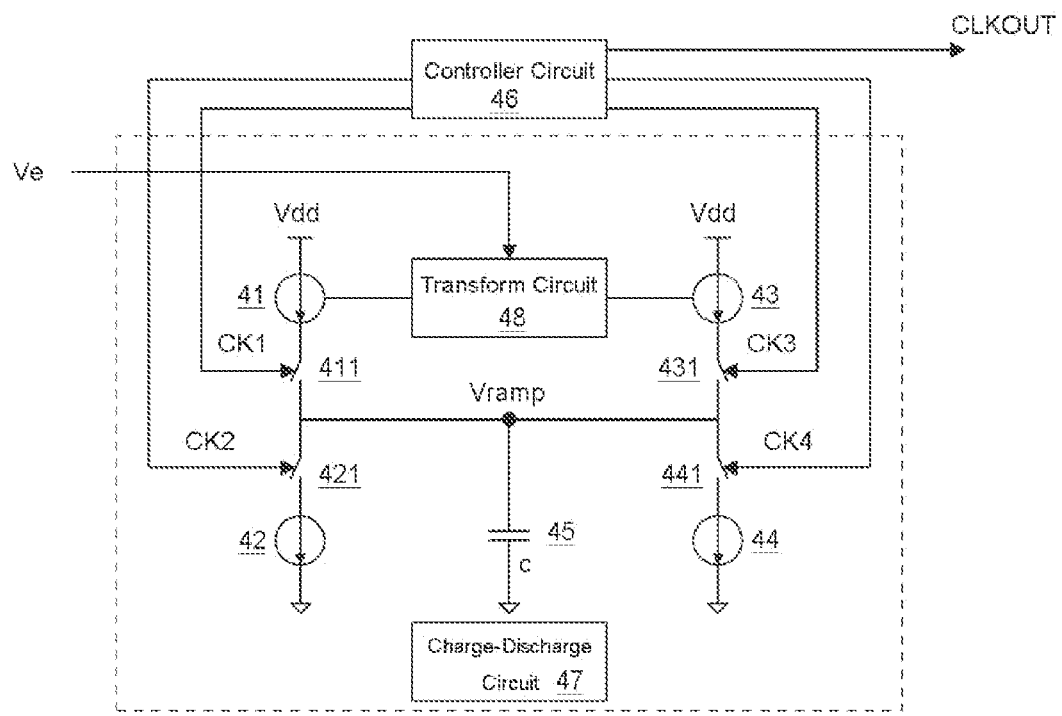
FIG. 2 is a diagram of the heterodyne dual-slope charge-discharge circuit of the prior art.

When the control circuit in the present invention is used in the power supply system of FIG. 1, the power transformer 4 accepts the input voltage Vin and provides the output voltage Vo to the loading device 6; the feedback control circuit 30 in accordance with the output voltage Vo level of the power transformer outputs a gate pulse to the power transformer 4 and provides different voltage level. Because the output voltage Vo of the power transform is input to the feedback error voltage Vfb on the second terminal of the feedback error amplifier 314 in the feedback control circuit 30 of the present invention, the output voltage Vo (ie, the feedback error voltage Vfb) of the power transformer will become larger when the loading device 6 is heavy loading. Then by the control of the feedback error amplifier 314, the second charge current source (Ic2) 309 outputs a small current, and the second reference voltage on the first input terminal (the positive terminal) of the reference threshold voltage circuit 305 provides a fixed clamp voltage, which further makes the heterodyne cross voltage for the first charge capacitor (C1) 306 and the second charge capacitor (C2) 307 also be changed. In this situation, the cross time for the first charge voltage (Vrp1) and the second charge voltage (Vrp2) will also be shortened, that is, the cross voltage for the first charge voltage (Vrp1) and the second charge voltage (Vrp2) will become lower, so the charge-discharge frequency for the first charge capacitor (C1) 306 and the second charge capacitor (C2) 307 will become faster, which leads to the output PWM control signal period of the feedback controller be shortened and provides enough the output power. Following, when the outer loading is light loading, the output voltage Vo (ie, the feedback error voltage Vfb) of the power transformer will become small. By the control of the feedback error amplifier 314, the second charge current source (Ic2) 309 will output a large current. Additionally, the second reference voltage Vref2 on the first input terminal (the positive terminal) of the reference threshold voltage circuit 305 provides a same and fixed clamp voltage and makes the second charge current source (Ic2) 309 start charging from this clamp voltage, which makes the charging rate of the second charge current source (Ic2) 309 changed and further makes the heterodyne cross voltage for the first charge capacitor (C1) 306 and the second charge capacitor (C2) 307 charging changed. In this situation, the cross time for the first charge voltage (Vrp1) and the second charge voltage (Vrp2) will become longer, that is, the cross voltage for the first charge voltage (Vrp1) and the second charge voltage (Vrp2) will become higher, which leads to the charge-discharge period for the first charge capacitor (C1) 306 and the second charge capacitor (C2) 307 will become longer. Therefore, the charge-discharge frequency for the first charge capacitor (C1) 306 and the second charge capacitor (C2) 307 will become lower, and results in the PWM control signal period for the feedback control become longer, which reduces the power consumption.

The description above is for explaining the preferred embodiments of the present invention and is not for limiting the scope of application. It is possible to make some modifications according to the above description or embodiments of the present invention. Hence, the spirit and the scope of the present invention are determined by the following claims and its equivalence.

What is claimed is:

1. A control method of a heterodyne dual-slope feedback circuit, comprising:
   starting a power supply system;
   providing a fixed charge current source to charge a first charge capacitor with a fixed current and generating a first charge slope;
   driving an outer loading and judging whether said outer loading is light loading;
   providing a feedback error voltage (Vfb) to a second terminal of a feedback error amplifier;
   driving a variable charge current source to generate a first current, which utilizes the control of said feedback error amplifier to drive said variable charge current to generate said first current;
   charging a second charge capacitor voltage (Vrp2), which utilizes said first current to charge said second capacitor voltage (Vrp2) under a higher DC voltage level to generate a second charge slope;
   comparing said first charge slope and said second charge slope, which utilizes a heterodyne method to determine a cross time of said first charge slope and said second charge slope, and do a discharging process when said first charge slope and said second charge slope crossover; and
   outputting a first PWM control signal, which utilizes a charge-discharge frequency according to said first charge slope and said second charge slope to generate said first PWM control signal.

2. The control method according to claim 1, when said outer loading is judged as heavy loading:
   providing said feedback error voltage (Vfb) to said second terminal of said feedback error amplifier;
   driving said variable charge current source to generate said first current, which utilizes the control of said feedback error amplifier to drive said variable charge current to generate said first current;
   charging said second charge capacitor voltage (Vrp2), which utilizes said first current to charge said second capacitor voltage (Vrp2) under said higher DC voltage level to generate said second charge slope;
   comparing said first charge slope and said second charge slope, which utilizes said heterodyne method to determine said cross time of said first charge slope and said second charge slope, and do a discharging process when said first charge slope and said second charge slope crossover; and
   outputting a second PWM control signal, which utilizes said charge-discharge frequency according to said first charge slope and said second charge slope to generate said second PWM control signal, and said second PWM control signal frequency is larger than said first PWM control signal frequency.

* * * * *